US012577676B2

(12) United States Patent
Moon et al.

(10) Patent No.: US 12,577,676 B2
(45) Date of Patent: Mar. 17, 2026

(54) CHEMICAL VAPOR DEPOSITION APPARATUS

(71) Applicant: LG ELECTRONICS INC., Seoul (KR)

(72) Inventors: Jinsan Moon, Seoul (KR); Wonbae Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 575 days.

(21) Appl. No.: 17/793,232

(22) PCT Filed: Jan. 17, 2020

(86) PCT No.: PCT/KR2020/000874
§ 371 (c)(1),
(2) Date: Jul. 15, 2022

(87) PCT Pub. No.: WO2021/145491
PCT Pub. Date: Jul. 22, 2021

(65) Prior Publication Data
US 2023/0105104 A1     Apr. 6, 2023

(51) Int. Cl.
*C23C 16/54*     (2006.01)
*C23C 16/26*     (2006.01)
*C23C 16/455*    (2006.01)

(52) U.S. Cl.
CPC ............ *C23C 16/545* (2013.01); *C23C 16/26* (2013.01); *C23C 16/45561* (2013.01); *C23C 16/45591* (2013.01)

(58) Field of Classification Search
None
See application file for complete search history.

(56) References Cited

U.S. PATENT DOCUMENTS

2002/0170496 A1* 11/2002 Ha ........................... B05D 1/62
                                              118/718
2011/0143019 A1* 6/2011 Mosso ................... C23C 16/56
                                              427/209

(Continued)

FOREIGN PATENT DOCUMENTS

| CN | 106702483 A | 5/2017 | |
| CN | 106835068 A * 6/2017 | ............. C23C 16/26 |
| KR | 10-2002-0088487 A | 11/2002 | |

(Continued)

OTHER PUBLICATIONS

English Machine Translations of Chinese Patent No. 106835068A to Li (Year: 2017).*

*Primary Examiner* — Jeffrie R Lund
*Assistant Examiner* — Tiffany Z Nuckols
(74) *Attorney, Agent, or Firm* — Birch, Stewart, Kolasch & Birch, LLP

(57) ABSTRACT

Discussed is a chemical vapor deposition apparatus that includes a reaction chamber with an open top and an open bottom, at least one inner partition wall can be in the reaction chamber and can divide an inner space of the reaction chamber in a height direction to form a plurality of division chambers. A heater can be further disposed at an outer surface of the reaction chamber, a plurality of upper winding rolls can be disposed above the reaction chamber, and at least one roller can be disposed below the reaction chamber.

16 Claims, 5 Drawing Sheets

(56) References Cited

U.S. PATENT DOCUMENTS

| | | | |
|---|---|---|---|
| 2021/0189565 A1* | 6/2021 | Jouvray | ............. C23C 16/4409 |
| 2022/0002875 A1* | 1/2022 | Yoshimura | ............ C23C 16/545 |

FOREIGN PATENT DOCUMENTS

| | | |
|---|---|---|
| KR | 10-2013-0143260 A | 12/2013 |
| KR | 10-2015-0030400 A | 3/2015 |
| KR | 10-2016-0119644 A | 10/2016 |
| KR | 10-2016-0126820 A | 11/2016 |
| KR | 10-2017-0071856 A | 6/2017 |
| WO | WO 2017/085412 A1 | 5/2017 |

* cited by examiner

100

(a)          (b)          (c)

CHEMICAL VAPOR DEPOSITION APPARATUS

CROSS REFERENCE TO RELATED APPLICATIONS

This application is the National Phase of PCT International Application No. PCT/KR2020/000874, filed on Jan. 17, 2020, all of which is hereby expressly incorporated by reference into the present application.

BACKGROUND

1. Technical Field

The present disclosure relates to a chemical vapor deposition apparatus. More specifically, the present disclosure relates to a chemical vapor deposition apparatus in which a division chamber is formed by dividing the reaction chamber.

2. Description of the Related Art

Graphene and the like may be formed using chemical vapor deposition (CVD). The chemical vapor deposition method is a process of depositing a film of a required material on a surface of a deposition target by supplying various gases that are deposition materials to the inside of a chamber forming a specific state such as a normal pressure, a low pressure, or plasma in general.

In this regard, KR 10-2013-0053201 discloses a roll-to-roll type chemical vapor deposition apparatus.

However, in the chemical vapor deposition apparatus disclosed in KR 10-2013-0053201, a plurality of chambers are vertically arranged, and thus, there is a problem in that a length or size of the apparatus is too large.

In addition, since it is necessary to form a heating zone for each chamber, there is a problem of low production efficiency.

SUMMARY

The technical challenges that present disclosure seeks to solve are as follows.

First, the present disclosure is to provide a compact chemical vapor deposition apparatus.

Second, the present disclosure is to provide a chemical vapor deposition apparatus capable of improving quality of chemical vapor deposition.

In addition, the present disclosure is intended to solve all problems that may arise or can be predicted from the prior art in addition to the technical problems described above.

According to an aspect of the present invention, there is provided a chemical vapor deposition apparatus including an inner partition wall dividing an inner space of a reaction chamber.

Specifically, the chemical vapor deposition apparatus includes a reaction chamber with open top and open bottom and at least one inner partition wall disposed in the reaction chamber and for dividing the inner space of the reaction chamber in the height direction to form a plurality of division chambers.

Moreover, the chemical vapor deposition apparatus includes a heater disposed at the outer surface of the reaction chamber, a plurality of upper winding rolls disposed above the reaction chamber, and at least one roller disposed below the reaction chamber.

Each of the plurality of division chambers may correspond to each of the plurality of upper winding rolls.

The chemical vapor deposition apparatus may further include a plurality of reaction gas supply pipes, and the plurality of reaction gas supply pipes may be connected to the plurality of division chambers, respectively.

The heater may be disposed on a side surface of the reaction chamber.

Each of the plurality of upper winding rolls may wind or unwind a deposition target.

The roller may include at least one guide roller, and the guide roller may guide the unwound deposition target for another winding roll to wind the unwound deposition target.

A first upper winding roll of the plurality of upper winding rolls may unwind the wound deposition target, and the guide roller may guide the unwound deposition target for a second upper winding roll to wind the unwound deposition target.

The guide roller may be disposed between each division chamber below the division chamber.

The roller may include a plurality of lower winding rolls, and each of the plurality of lower winding rolls may correspond to each of the plurality of upper winding rolls.

The upper winding roll may unwind the deposition target and the lower winding roll may wind the deposition target.

The chemical vapor deposition apparatus may further include a baffle for shielding the open top and the open bottom of the reaction chamber.

The baffle may include at least one of graphite, stainless steel, titanium, nickel, Inconel alloy, and quartz.

The baffle may include an upper baffle for shielding the open top of the reaction chamber and a lower baffle for shielding the open bottom of the reaction chamber, and the upper baffle and the lower baffle may include a plurality of slots through which a deposited layer passes.

Each of the plurality of slots may correspond to each of the plurality of division chambers.

The upper baffle may include a coupling portion coupled to a reaction gas supply pipe, a baffle plate including a plurality of slots, and a lower baffle tube disposed below the baffle plate and including a plurality of through holes and a plurality of slots.

A thickness of the lower baffle tube may be thicker than a thickness of the baffle plate.

The upper baffle may include a coupling portion coupled to the reaction gas supply pipe and a baffle plate including a plurality of slots, and include a plurality of diffusion baffle plate spaced apart from the baffle plate below the baffle plate.

The plurality of diffusion baffle plates may be sequentially disposed to be spaced apart from each other, and each diffusion baffle plate includes the plurality of slots and through holes.

In the plurality of diffusion baffle plate, the number of through holes may increase toward a lower side.

The lower baffle may include a plurality of slots and a through holes may not be formed in the lower baffle.

Effects of the Disclosure

The effect of the chemical vapor deposition apparatus according to the present disclosure configured as described above will be described as follows.

The chemical vapor deposition apparatus of the present disclosure can be made compact by dividing the inner space of the reaction chamber with an inner partition wall, and at the same time, since the divided inner space can share a heater, production efficiency can be improved.

In addition, by including a baffle for shielding the opening of the reaction chamber, it is possible to reduce the temperature non-uniformity and improve the chemical vapor deposition quality.

BRIEF DESCRIPTION OF THE DRAWINGS

The embodiments will be described in detail with reference to the following drawings in which like reference numerals refer to like elements wherein.

DETAILED DESCRIPTION

Figure 1:
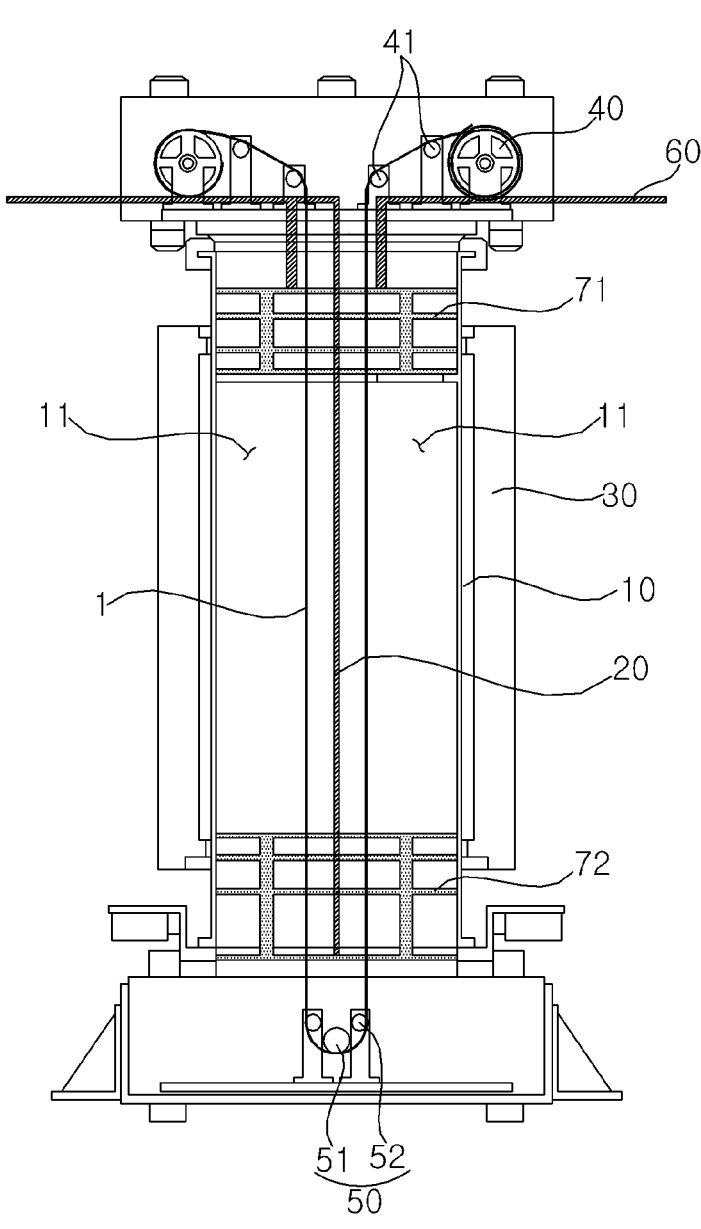
FIG. 1 is a cross-sectional view of a chemical vapor deposition apparatus according to one embodiment of the present disclosure.

Advantages and features of the present disclosure, and how to achieve them, will become clear with reference to embodiments described below.

The present disclosure is defined by the scope of claims, and when there is a separate description for the meaning of a term in the specification, the meaning of the term will be defined by the above description. Like reference numerals refer to like elements throughout.

A chemical vapor deposition apparatus 100 of the present disclosure can be made compact by dividing an inner space of a reaction chamber 10 by an inner partition wall 20, and since the divided inner space can share a heater 30, the production efficiency can be improved.

In this regard, the chemical vapor deposition apparatus 100 according to one embodiment of the present disclosure will be described with reference to FIGS. 1 to 4.

Specifically, referring to FIG. 1, the chemical vapor deposition apparatus 100 may include a reaction chamber 10 with open top and open bottom.

The reaction chamber 10 may provide a space in which a chemical vapor deposition process is performed by forming an inner space of a predetermined size.

The reaction chamber 10 may be cylindrical-shaped extending in the height direction.

The cylindrical shape in the present specification may be a geometric cylindrical-shaped such as a cylinder or a quadrangular prism, but is not limited thereto, and includes a non-geometric cylindrical shape that has a width, a length, and a height to form an inner space.

The reaction chamber 10 may be made of a material having excellent wear resistance and corrosion resistance. For example, the reaction chamber 10 may be formed of quartz, but is not limited thereto.

Figure 2:
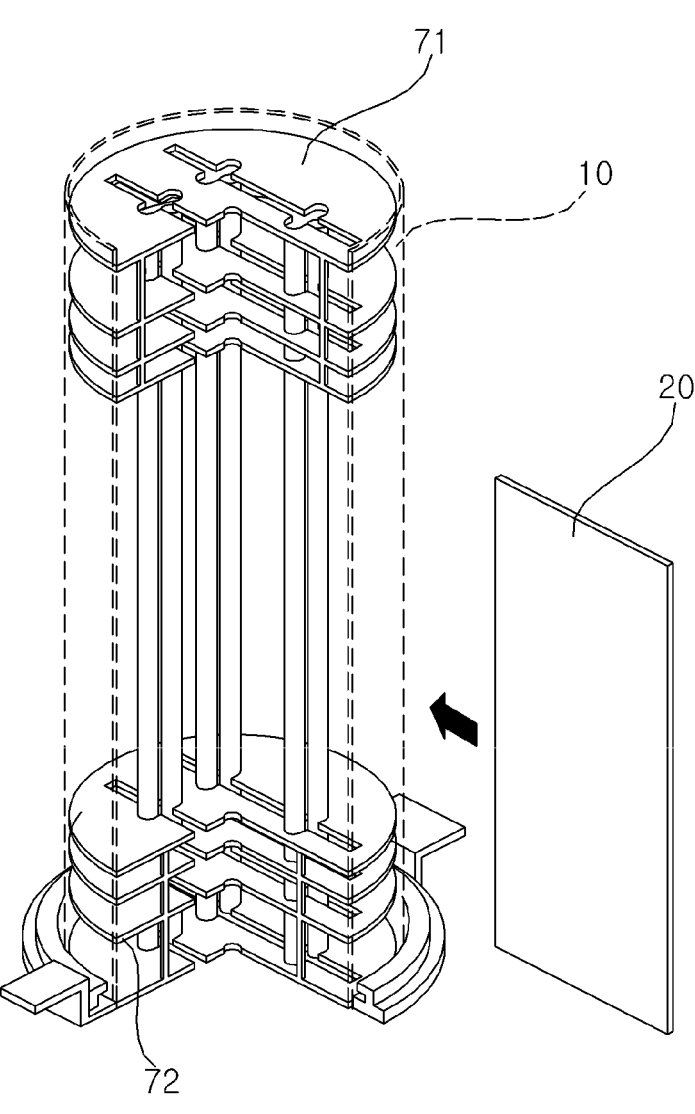
FIG. 2 is a perspective view showing a coupling configuration of a reaction chamber of a chemical vapor deposition apparatus according to one embodiment of the present disclosure.

Then, referring to FIGS. 1 and 2, the chemical vapor deposition apparatus 100 according to one embodiment of the present disclosure may further include an inner partition wall 20 to divide the inner space.

Specifically, the inner partition wall 20 is disposed inside the reaction chamber 10 and divides the inner space of the reaction chamber 10 in the height direction to form a plurality of division chambers 11.

The inner partition wall 20 is inserted so that the edge of the inner partition wall 20 is in contact with the inner surface of the reaction chamber 10 to divide the inner space of the reaction chamber 10 to form the plurality of division chambers 11.

In addition, the inner partition wall 20 may be arranged by inserting the inner partition wall 20 in the height direction of the reaction chamber 10, so that the inner space of the reaction chamber 10 can be divided in the height direction.

That is, when looking at the cross section of the reaction chamber 10 cut in the direction perpendicular to the height direction, the inner partition wall 20 located between the plurality of division chambers 11 is located in the cross section.

Further, each of the plurality of division chambers 11 may be physically separated from other division chambers 11 by the inner partition wall 20 as a separate space.

There may be at least one inner partition wall 20 included in the chemical vapor deposition apparatus 100 according to one embodiment of the present disclosure.

For example, when one inner partition wall 20 is provided, two division chambers 11 may be formed, or when two inner partition wall 20 intersecting each other are provided, four division chambers 11 may be formed.

Meanwhile, the number of the inner partition wall 20 and the number of division chambers 11 are not limited to the structures shown in the description and drawings, and a person skilled in the art can adjust the number of inner partition walls 20 and the division chambers 11 within a range that can be easily designed.

Additionally, when the plurality of inner partition walls 20 are included, the plurality of inner partition walls 20 cross each other so that an angle between the inner partition walls 20 can be formed at an equal angle.

However, the structure of the plurality of inner partition wall 20 is also not limited to the above description, and may include a structure that can be easily changed by a person of ordinary skill in the art to form the plurality of division chambers 11 and at the same time to independently divide each division chamber 11.

The inner partition wall 20 may include at least one of quartz, graphite, titanium, nickel, Inconel alloy, and stainless steel, but is not limited thereto, and includes materials that can be easily designed and changed by those skilled in the art.

Meanwhile, the inner partition wall 20 does not divide the entire inner space of the reaction chamber 10, the inner partition wall may divide a central part. That is, a height of the inner partition wall 20 is smaller than the height of the reaction chamber 10, and thus, a portion of each of the top and the bottom of the reaction chamber 10 may be not divided, and the central part thereof may be divided by the inner partition wall 20.

Each region divided by the inner partition wall 20 may be an active zone in which actual chemical vapor deposition is performed.

The chemical vapor deposition apparatus 100 according to one embodiment of the present disclosure may include a heater 30 disposed on a side surface of the reaction chamber 10.

Specifically, the heater 30 may be formed in a structure surrounding the reaction chamber 10 on the outer surface or the inner surface of the reaction chamber 10.

That is, the heater 30 surrounds the outer surface of the reaction chamber 10, and in a cross-section cut in a direction perpendicular to the height direction of the reaction chamber 10, the heater 30 may be annular.

In the chemical vapor deposition apparatus 100 according to one embodiment of the present disclosure, the heater 30 is disposed on the outer surface of the reaction chamber 10 to surround the outer surface of the reaction chamber 10, and thus, the division chambers 11 may share a heater 30.

Therefore, even when a heater for each of the plurality of division chambers 11 is not provided, heat can be transferred to each of the plurality of division chambers 11 by operating the heater 30.

The heater 30 may include at least one of a resistance coil, a halogen lamp, and an IR heater, but the configuration of the heater 30 is not limited to the above description, and the heater 30 may include a heater which can be applied to a chemical vapor deposition apparatus by a person skilled in the art.

The chemical vapor deposition apparatus 100 according to one embodiment of the present disclosure may include a plurality of upper winding rolls 40 disposed above the reaction chamber 10. The plurality of upper winding rolls 40 may be disposed to be spaced apart from the reaction chamber 10 above the reaction chamber 10.

Each of the plurality of upper winding rolls 40 may wind or unwind a deposition target 1 on which deposition is performed in a chemical vapor deposition process in a roll shape.

That is, all of the plurality of upper winding rolls 40 may unwind the deposition target 1, some upper winding rolls 40 may unwind the deposition target 1, and some different upper winding rolls 40 may wind the deposition target 40.

The operation of the plurality of upper winding rolls 40 may be determined by the roller 50, and a detailed description thereof will be described later.

The deposition target 1 is a target on which chemical vapor deposition is performed, and may include a catalytic metal, for example, copper. However, the type of the deposition target 1 is not limited to the above description, and it will be said that the deposition target includes a target 1 to be deposited applicable to the chemical vapor deposition method.

Meanwhile, in the chemical vapor deposition apparatus 100 according to one embodiment of the present disclosure, the number of the plurality of upper winding rolls 40 and the number of the plurality of division chambers 11 may be the same, and further, each winding roll 40 may be disposed to correspond to each division chamber.

That is, the deposition target 1 unwound from each upper winding roll 40 can each move to the division chamber 11 divided independently to each other, or the deposition target 1 exiting from each division chamber 11 may be wound on each upper winding roll 40.

The deposition target 1 unwound from each upper winding roll 40 or the deposition target 1 exiting from each division chamber 11 may be guided by one of a plurality of upper auxiliary guide rollers 41 to be introduced to the division chamber 11 or may be wound on the upper winding roll 40.

Specifically, by the thickness of the deposition target 1 wound on the upper winding roll 40 or the size of the upper winding roll 40 itself, the position of the upper winding roll 40 and the position of the division chamber 11 corresponding thereto may not be aligned.

Accordingly, the upper auxiliary guide roller 41 may be disposed at a point aligned with the central position of the division chamber 11, and the deposition target 1 unwound from the upper winding roll 40 may be guided by the upper auxiliary guide roller 41 and may be stably introduced into the corresponding division chamber 11.

Conversely, the deposition target 1 exiting from the division chamber 11 may be guided by the upper auxiliary guide roller 41 and may be stably wound on the upper winding roll 40.

Meanwhile, the chemical vapor deposition apparatus 100 according to one embodiment of the present disclosure may further include a plurality of reaction gas supply pipes 60.

The plurality of reaction gas supply pipes 60 may be connected to the plurality of division chambers 11 to supply source gases used for chemical vapor deposition.

For example, the reaction gas supply pipe 60 may supply methane (CH4) gas as a carbon source including a carrier gas.

As the carrier gas, gases such as hydrogen (H2), argon (Ar) and nitrogen (N2) can be used as a single gas or a mixed gas, and by supplying methane gas together with a carrier gas, graphene can be deposited on the deposition target 1.

In the chemical vapor deposition apparatus 100 according to one embodiment of the present disclosure, the reaction gas supply pipe 60 is connected to each of the plurality of division chambers 11, it is possible to configure different chemical vapor deposition conditions for each division chamber 11.

The chemical vapor deposition apparatus 100 according to one embodiment of the present disclosure may include at least one roller 50 disposed below the reaction chamber 100.

Specifically, the roller 50 includes at least one guide roller 51, and the guide roller 51 is disposed below the inner partition wall 20 and may guide the deposition target 1 unwound from one of the upper winding rolls 40 so that the deposition target 1 is wound by another upper winding roll 40.

Meanwhile, the roller 50 may further include a lower auxiliary guide roller 52.

When the deposition target 1 exiting from the division chamber 11 moves directly to the guide roller 51 disposed on the lower side between the adjacent division chambers 11, a moving direction of the deposition target (1) has a slope, which may cause reduction in deposition quality.

Accordingly, the lower auxiliary guide roller 52 is disposed at the point aligned with the central position of the division chamber 11 from the lower side of the division chamber 11, the deposition target 1 exiting from the division chamber 11 is guided to the guide roller 51 by the lower auxiliary guide roller 52, and thus, it is possible to prevent the deposition quality from decreasing.

Subsequently, the deposition target 1 guided by the guide roller 51 can be guided again by another lower auxiliary guide roller 52 to be introduced into another division chamber 11.

The lower auxiliary guide roller 52 and the upper auxiliary guide roller 51 may be disposed on a vertical line to correspond to each other.

In the present specification, the roller may have a rotatable roller shape, but is not limited thereto and may have a non-rotatable bar shape.

That is, the chemical vapor deposition apparatus 100 according to one embodiment of the present disclosure includes a guide roller 51, and thus, the deposition target 1 unwound from a specific upper winding roll 40 can go through at least two or more division chambers 11.

Furthermore, the number of guide rollers 51 may vary depending on the number of division chambers 11.

For example, when two division chambers 11 are formed in which the inner space of the reaction chamber 10 is divided into two equal parts, one guide roller 51 may be disposed, and three division chambers 11 are formed in which the inner space of the reaction chamber 10 is divided into three equal parts, two guide rollers 51 may be disposed.

The chemical vapor deposition apparatus 100 according to one embodiment of the present disclosure includes the division chamber 11 independently divided by an inner partition wall 20, the plurality of upper winding rolls 40 arranged to correspond to the division chamber 11, the reaction gas supply pipe 60, and the guide roller 51.

Therefore, since chemical vapor deposition under different conditions can be performed using one reaction chamber 10, the chemical vapor deposition apparatus 100 can be made compact, and at the same time, continuous deposition is possible by connecting the division chamber 11, and thus, productivity can be improved.

Next, a coupling relationship between the division chamber 11, the upper winding roll 40, the reaction gas supply pipe 60, and the guide roller 51 implementing the compactness and productivity improvement will be described in detail.

Referring again to FIGS. 1 and 2, the first upper winding roll 40, which is one of the plurality of upper winding rolls, can unwind the deposition target 1 wound in a roll form, and the unwound deposition target 1 is introduced into the first division chamber 11 corresponding to the first upper winding roll 40 through the first upper auxiliary guide roller 41.

The deposition target 1 introduced into the first division chamber 11 is supplied with the reaction gas of the first condition from the reaction gas supply pipe 60 connected to the first division chamber 11, the heater 30 performs heating to realize the chemical vapor deposition, and thus, the first chemical vapor deposition may be performed on the deposition target 1.

The deposition target 1 on which the first chemical vapor deposition has been performed moves in the lower direction and is guided by the first and second lower auxiliary guide rollers 52 and the guide roller 51 to move to the second division chamber 11.

The deposition target 11 moved to the second division chamber 11 is supplied with a reaction gas of the second condition from the reaction gas supply pipe 60 connected to the second division chamber 11, the heater 30 performs heating to realize the chemical vapor deposition, and thus, the second chemical vapor deposition may be performed on the deposition target 1.

The deposition target 1 subjected to the second chemical vapor deposition may be guided by the second upper auxiliary guide roller 41 and wound by the second upper winding roll 40 corresponding to the second division chamber 11.

The first condition and the second condition may include a type, a flow rate, and a pressure environment of the reaction gas, and in the first and second chemical vapor deposition using the chemical vapor deposition apparatus 100, and the first condition and the second condition of the reaction gas may be the same or different from each other.

That is, when the first condition is different from the second condition, different first and second chemical vapor depositions may be effectively performed using one reaction chamber 10. In addition, when the first condition and the second condition are the same, the effect of repeated deposition can be performed using one reaction chamber 10, and thus, the chemical vapor deposition apparatus 100 can be compacted and the productivity of the chemical vapor deposition can be improved.

Next, a baffle 70 of the chemical vapor deposition apparatus 100 according to one embodiment of the present disclosure will be described with reference to FIGS. 1, 3 and 4.

The chemical vapor deposition apparatus 100 according to one embodiment of the present disclosure may include the baffle 70 to reduce chemical vapor deposition temperature non-uniformity, thereby improving deposition quality.

Specifically, the baffle 70 of the chemical vapor deposition apparatus 100 may be disposed on the open top and the open bottom of the reaction chamber 10 to shield each of the openings.

In the present specification, that the reaction chamber 10 is shielded by the baffle 70 means that the baffle 70 covers at least a part of the opening of the reaction chamber 10, and does not mean that the inner space of the reaction chamber 10 is completely blocked from the outside by the baffle 70 and separated.

Figure 3:
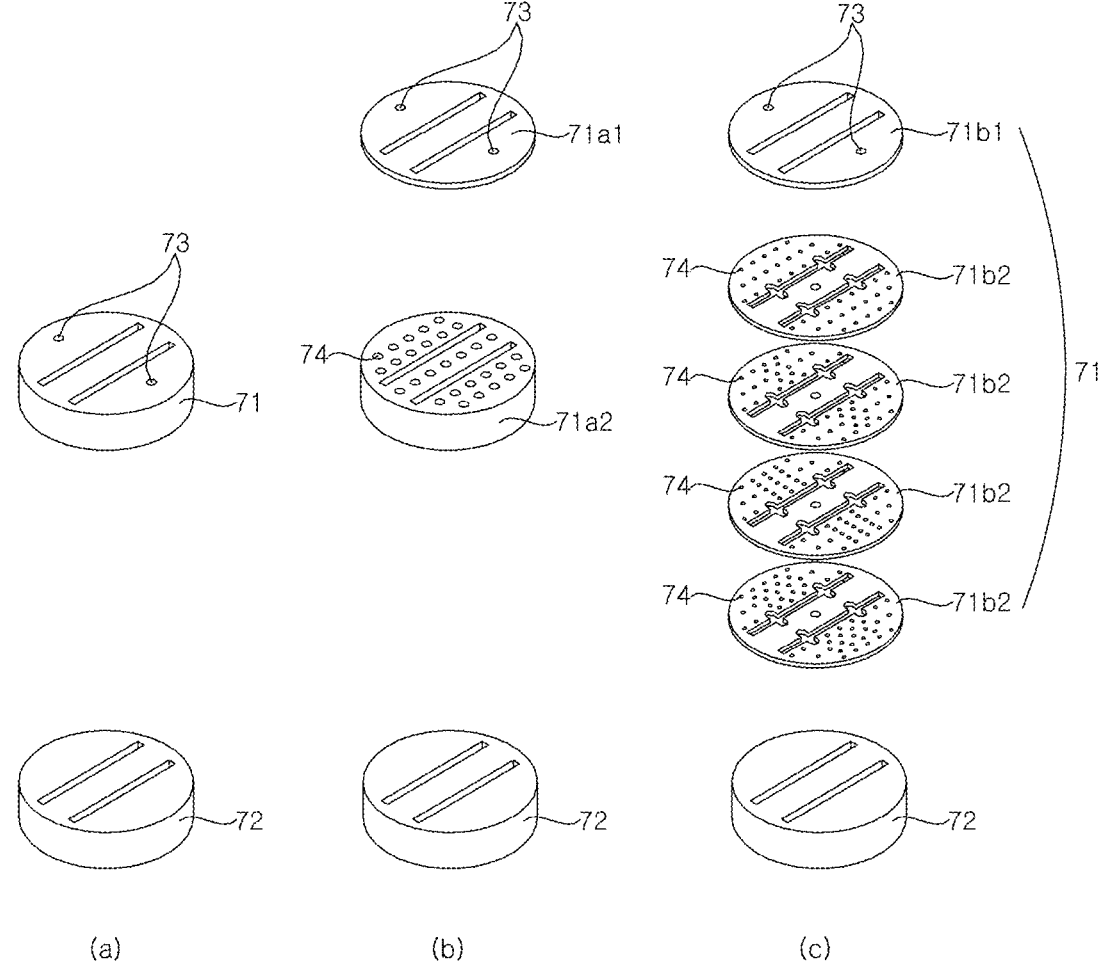
FIG. 3 is a perspective view showing an upper baffle and a lower baffle according to one embodiment of the present disclosure.

In more detail, referring to FIG. 3(*a*), the baffle 70 includes an upper baffle 71 disposed in the top of the reaction chamber 10 for shielding the open top and a lower baffle 72 disposed in the bottom for shielding the open bottom, the upper baffle 71 and the lower baffle 72 may include a plurality of slots through which the deposition target 1 passes. Furthermore, the slot is formed to correspond to each of the division chambers 11.

In addition, the upper baffle 71 may form a plurality of coupling portions 73 to which each of the reaction gas supply pipes 60 corresponding to each of the division chambers 11 are connected.

For example, the coupling portion 73 may be a through portion of the upper baffle 71, and the reaction gas supply pipe 60 may be coupled to the through portion to supply the reaction gas into the division chamber 11.

That is, the upper and lower sides of each division chamber 11 are shielded by the upper baffle 71 and the lower baffle 72, the deposition target 1 enters and exits slots formed in the upper baffle 71 and the lower baffle 72, each reaction gas supply pipe 60 is connected to the upper baffle 71, and thus, a reaction gas having independent conditions is supplied.

Meanwhile, in the chemical vapor deposition apparatus 100 according to one embodiment of the present disclosure, the upper baffle 71 and the lower baffle 72 each shield the open top and the open bottom of the reaction chamber 10, and thus, it is possible to prevent vertical heat loss that may occur due to the opening of the reaction chamber 10.

Figure 4:
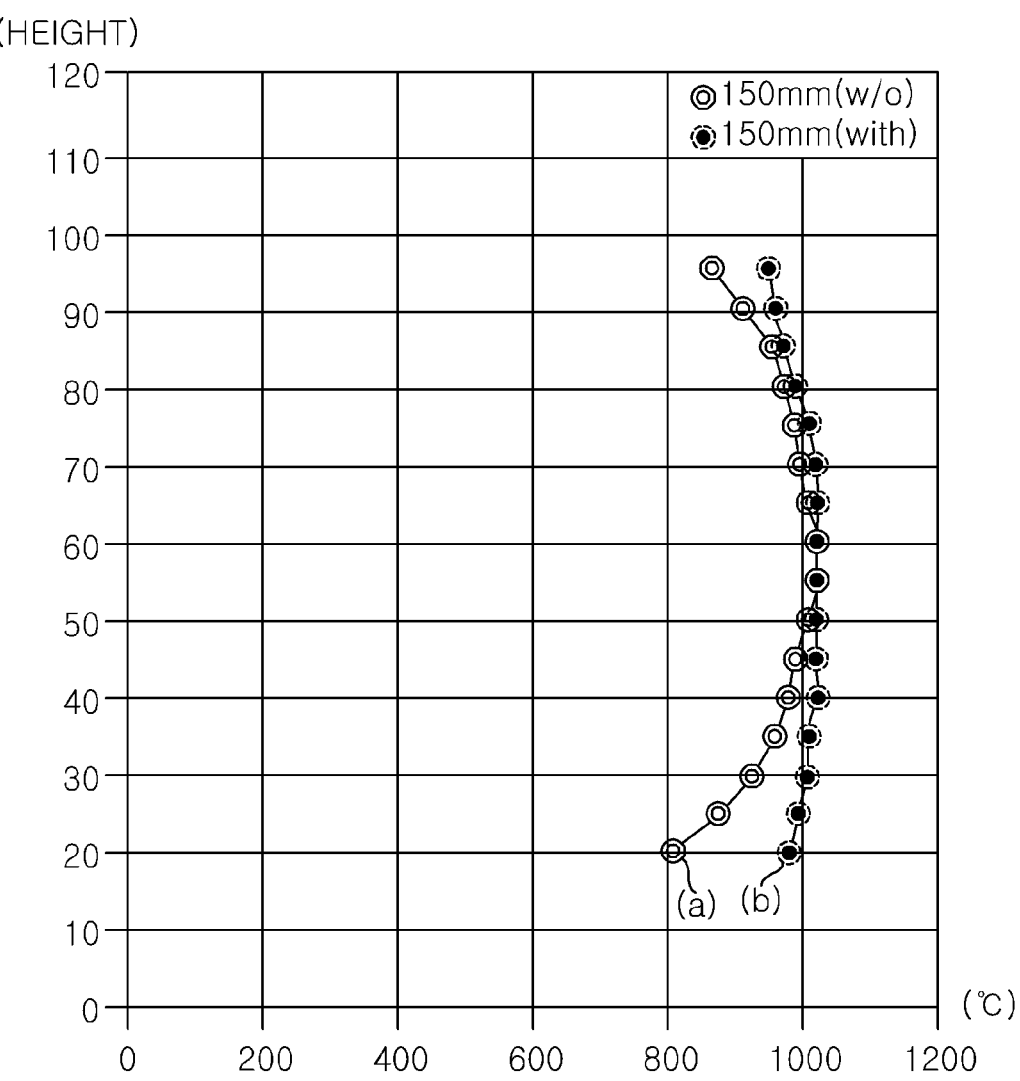
FIG. 4 is a temperature distribution according to the height in the reaction chamber according to Example of the present disclosure and Comparative Example.

Referring to FIG. 4, when the baffle 70 is not included (a), heat flows out from the top and bottom of the reaction chamber 10, the temperature inside the reaction chamber 10 is not uniform, and thus, as it approaches the open top and the open bottom, the temperature may be significantly lower than that of the central part.

However, when the baffle 70 according to one embodiment of the present disclosure shields the open top and the open bottom of the reaction chamber 10 (*b*), by preventing heat loss from the top and bottom of the reaction chamber 10, the chemical vapor deposition temperature can be uniformed, and as a result, the deposition quality can be improved.

In the chemical vapor deposition apparatus 100 according to one embodiment of the present disclosure, the baffle 70 may include at least one of graphite, stainless steel, and quartz in order to effectively maintain a uniform temperature in the reaction chamber 10.

As the baffle 70 includes the above-mentioned materials, the temperature in the reaction chamber 10 may not be effectively discharged to the outside.

However, the material constituting the baffle 70 is not limited to the above description, and it will be said that it includes a range that can be easily designed and changed by a person skilled in the art.

In addition, in the chemical vapor deposition apparatus 100 according to the present disclosure, by controlling the shape of the upper baffle 71 to improve reaction gas diffusivity, the quality of chemical vapor deposition can be further improved.

First, referring to FIG. 3(b), the upper baffle 71 may include a coupling portion 73 connected to the reaction gas supply pipe 60, a baffle plate 71a1 having a plurality of slots, and a lower baffle tube 71a2 which is located below the baffle plate 71a1 and has a plurality of through holes 74 and a plurality of slots.

The baffle plate 71a1 and the lower baffle tube 71a2 may be disposed with a spaced apart distance, and the reaction gas supply pipe 60 is coupled to the coupling portion 73 to supply a reaction gas to the reaction chamber 11 between the baffle plate 71a1 and the lower baffle tube 71a2.

In this case, the sprayed reaction gas may be diffused between the baffle plate 71a1 and the lower baffle tube 71a2 and distributed to the division chamber 11 by the plurality of through holes 74 formed in the lower baffle tube 71a2.

That is, in the chemical vapor deposition apparatus 100 according to one embodiment of the present disclosure, the reaction gas is distributed by the plurality of through holes 74 and supplied to the division chamber 11, and thus, it is possible to effectively prevent deposition quality deterioration caused by local concentration or lack of the reactive gas.

Meanwhile, the lower baffle tube 71a2 may be thicker than the baffle plate 71a1.

The chemical vapor deposition apparatus 100 according to one embodiment of the present disclosure controls a thickness between the lower baffle tube 71a2 and the baffle plate 71a1 and forms a spaced apart distance between the lower baffle tube 71a2 and the baffle plate 71a1. Accordingly, it is possible to effectively prevent the heat leakage of the division chamber 11.

Specifically, since a relatively thick lower baffle tube 71a2 is located on the lower side, most of the heat leaking out from the division chamber 11 can be blocked. Moreover, an air layer formed between the lower baffle barrel 71a2 and the baffle plate 71a1 has low thermal conductivity, and thus, it is possible to more effectively reduce the heat leaking out.

The upper baffle 71 is not limited to the structure shown in the above description and drawings. For example, referring to FIG. 3(c), the upper baffle 71 may include the coupling portion 73 coupled to the reaction gas supply pipe 60, a baffle plate 71b1 having a plurality of slots, and a plurality of diffusion baffle plates 71b2 spaced apart the diffusion baffle plates 71b2.

Specifically, the plurality of diffusion baffle plates 71b2 may be sequentially disposed below the baffle plate 71b1, and a plurality of slots and through holes 74 may be formed in each of the diffusion baffle plates 71b2.

In the upper baffle 71 of FIG. 3(c), the reaction gas supply pipe 60 is coupled to the coupling portion 73, and the reaction gas is supplied to the reaction chamber 11 between the baffle plate 71b1 and the diffusion baffle plate 71b2.

In this case, the injected reaction gas may be diffused between the baffle plate 71b1 and the uppermost diffusion baffle plate 71b2, and distributed and supplied to the division chamber 11 via the plurality of through holes 74 formed in the plurality of diffusion baffle plates 71b2.

The plurality of slots and through holes 74 may be formed in each of the plurality of diffusion baffle plates 71b2, and the number of through holes 74 formed in the diffusion baffle plate 71b2 may increase toward the lower side.

That is, the upper baffle 71 according to one embodiment of the present disclosure includes the plurality of diffusion baffle plates 71b2, the number of through holes 74 formed in the diffusion baffle plate 71b2 increases toward the lower side, and thus, it is possible to further improve the diffusivity of the reaction gas.

Specifically, the plurality of diffusion baffle plates 71b2 are spaced apart from each other, the injected reaction gas is diffused again in the spaced apart gas whenever the reaction gas passes through the through hole 74 of each diffusion baffle plate 71b2, and since the number of through holes 74 increases toward the lower side, the reaction gas can be efficiently dispersed throughout the entire division chamber 11.

In the lower baffle 72 of the chemical vapor deposition apparatus 100 according to one embodiment of the present disclosure, a plurality of slots may be formed like the upper baffle 71, but a through hole may not be formed.

Residual reaction gas that has not reacted in the chemical vapor deposition process may be discharged to the outside of the reaction chamber 10 through an exhaust unit (not shown) connected to a vacuum pump (not shown).

Next, a chemical vapor deposition apparatus 200 according to another embodiment of the present disclosure will be described with reference to FIG. 5.

The chemical vapor deposition apparatus 200 according to this embodiment is substantially the same as the chemical vapor deposition apparatus 100 described with reference to FIGS. 1 to 4, except that the configuration and structure of the roller 50 are different. Accordingly, the same reference numerals refer to the same components, and thus repeated descriptions will be omitted. Therefore, in the description according to the present embodiment, differences therebetween will be mainly described.

Figure 5:
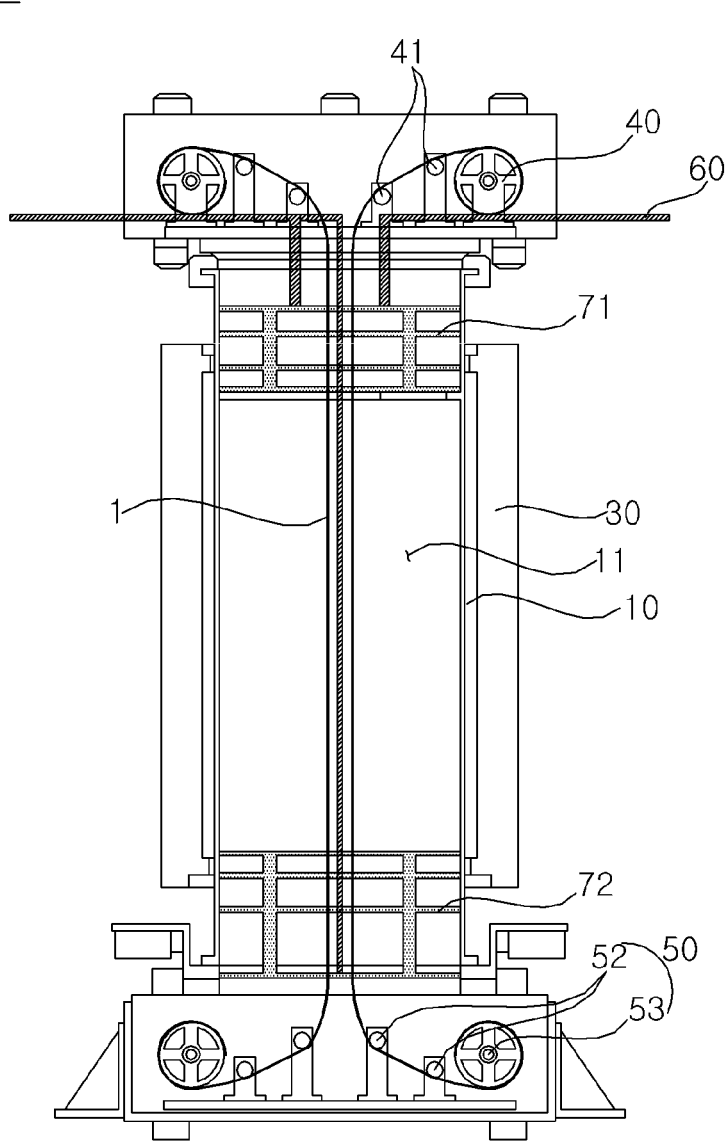
FIG. 5 is a cross-sectional view of a chemical vapor deposition apparatus according to another embodiment of the present disclosure.

Referring to FIG. 5, in the chemical vapor deposition apparatus 200 according to one embodiment of the present disclosure, the roller 50 may include a lower auxiliary guide roller 52 and a plurality of winding rolls 53.

Each of the plurality of lower winding rolls 53 may be disposed below each division chamber 11 to correspond to each of the plurality of upper winding rolls 40.

Therefore, for each division chamber 11, the upper winding roll 40 can unwind the wound deposition target 1, and the unwound deposition target 1 is subjected to chemical vapor deposition in the division chamber 11. Moreover, the deposition target 1 subjected to the chemical vapor deposition is guided by the lower auxiliary guide roller 52 and can be rewound by the lower winding roll 53.

As mentioned above, although the embodiments of the present disclosure have been illustrated and described, the present disclosure is not limited to the specific embodiments described above, and in the present disclosure, various modifications can be made by a person with ordinary knowledge in the technical field to which the invention belongs without departing from the gist of the present disclosure claimed in claims, and these modifications should not be individually understood from the technical spirit or perspective of the present disclosure.

What is claimed is:

1. A chemical vapor deposition apparatus comprising:
a reaction chamber with an open top and an open bottom;
at least one inner partition wall disposed in the reaction chamber and dividing an inner space of the reaction chamber along a height direction to form a plurality of division chambers;
a heater disposed at an outer surface of the reaction chamber;
a plurality of upper winding rolls disposed above the reaction chamber;
at least one roller disposed below the reaction chamber; and
baffles configured to shield the open top and the open bottom of the reaction chamber, respectively,
wherein the baffles include an upper baffle for shielding the open top of the reaction chamber and a lower baffle for shielding the open bottom of the reaction chamber,
wherein the upper baffle and the lower baffle include a plurality of slots through which a deposited layer passes,
wherein the upper baffle comprises a coupling portion coupled to at least one reaction gas supply pipe, a baffle plate including the plurality of slots, and a plurality of diffusion baffle plates spaced apart from the baffle plate below the baffle plate, and
wherein in the plurality of diffusion baffle plates, a number of through holes increases in the plurality of diffusion baffle plates that are positioned lower in the reaction chamber.

2. The chemical vapor deposition apparatus of claim 1, wherein each of the plurality of division chambers corresponds to each of the plurality of upper winding rolls, respectively.

3. The chemical vapor deposition apparatus of claim 1, further comprising a plurality of reaction gas supply pipes,
wherein the plurality of reaction gas supply pipes are connected to the plurality of division chambers, respectively.

4. The chemical vapor deposition apparatus of claim 1, wherein the heater is disposed on a side surface of the reaction chamber.

5. The chemical vapor deposition apparatus of claim 1, wherein a deposition target is wound or unwound from each of the plurality of upper winding rolls.

6. The chemical vapor deposition apparatus of claim 5, wherein the at least one roller includes at least one guide roller, and wherein the at least one guide roller guides an unwound deposition target unwound from one upper winding roll to another upper winding roll to wind the unwound deposition target, from among the plurality of upper winding rolls.

7. The chemical vapor deposition apparatus of claim 6, wherein a first upper winding roll of the plurality of upper winding rolls unwinds a wound deposition target, and the guide roller guides the unwound deposition target for a second upper winding roll to wind the unwound deposition target.

8. The chemical vapor deposition apparatus of claim 6, wherein the at least one guide roller is disposed between each division chamber below the reaction chamber.

9. The chemical vapor deposition apparatus of claim 1, wherein at least one guide roller includes a plurality of lower winding rolls, and
wherein each of the plurality of lower winding rolls corresponds to each of the plurality of upper winding rolls, respectively.

10. The chemical vapor deposition apparatus of claim 9, wherein an upper winding roll among the plurality of upper winding rolls unwinds a deposition target and a lower winding roll among the plurality of upper winding roll winds the deposition target.

11. The chemical vapor deposition apparatus of claim 1, wherein the baffles include at least one of graphite, stainless steel, titanium, nickel, Inconel alloy, and quartz.

12. The chemical vapor deposition apparatus of claim 1, wherein each of the plurality of slots corresponds to each of the plurality of division chambers, respectively.

13. The chemical vapor deposition apparatus of claim 1, wherein the upper baffle comprises a lower baffle tube disposed below the baffle plate including a plurality of through holes and the plurality of slots.

14. The chemical vapor deposition apparatus of claim 13, wherein a thickness of the lower baffle tube is thicker than a thickness of the baffle plate.

15. The chemical vapor deposition apparatus of claim 1, wherein the plurality of diffusion baffle plates are sequentially disposed to be spaced apart from each other, and each diffusion baffle plate includes the plurality of slots and through holes.

16. The chemical vapor deposition apparatus of claim 1, wherein the lower baffle includes the plurality of slots, and lacks a through hole.

* * * * *